(12) United States Patent
Suda et al.

(10) Patent No.: US 10,844,490 B2
(45) Date of Patent: Nov. 24, 2020

(54) VAPOR PHASE FILM DEPOSITION APPARATUS

(71) Applicant: Hermes-Epitek Corp., Taipei (TW)

(72) Inventors: Noboru Suda, Kyoto (JP); Junji Komeno, Kanagawa (JP); Takahiro Oishi, Kanagawa (JP); Shih-Yung Shieh, Hsinchu (TW); Tsan-Hua Huang, Tainan (TW)

(73) Assignee: HERMES-EPITEK CORP., Taipei (TW)

( * ) Notice: Subject to any disclaimer, the term of this patent is extended or adjusted under 35 U.S.C. 154(b) by 204 days.

(21) Appl. No.: 16/005,321

(22) Filed: Jun. 11, 2018

(65) Prior Publication Data
US 2019/0376179 A1   Dec. 12, 2019

(51) Int. Cl.
*C23C 16/458* (2006.01)
*C23C 16/455* (2006.01)
*C23C 16/46* (2006.01)

(52) U.S. Cl.
CPC ...... *C23C 16/4586* (2013.01); *C23C 16/4584* (2013.01); *C23C 16/45508* (2013.01); *C23C 16/46* (2013.01)

(58) Field of Classification Search
USPC .......................... 118/715, 719, 724, 725, 728
See application file for complete search history.

(56) References Cited

U.S. PATENT DOCUMENTS

| 4,987,856 A * | 1/1991 | Hey ...................... C23C 16/455 118/715 |
| 5,558,717 A * | 9/1996 | Zhao ................... C23C 16/4401 118/715 |
| 2009/0314309 A1* | 12/2009 | Sankarakrishnan ...... B08B 5/00 134/1.1 |
| 2011/0092072 A1* | 4/2011 | Singh .................... C23C 14/541 438/710 |
| 2013/0040414 A1* | 2/2013 | Niira ................. C23C 16/45565 438/57 |
| 2015/0096496 A1 | 4/2015 | Suda et al. |

* cited by examiner

*Primary Examiner* — Yewebdar T Tadesse
(74) *Attorney, Agent, or Firm* — Muncy, Geissler, Olds & Lowe, P.C.

(57) ABSTRACT

A vapor phase film deposition apparatus comprises a susceptor where a plurality of substrates is placed thereon; and an opposing face member disposed opposite to the susceptor. The opposing face member includes a plurality of raised portions which protrude toward the susceptor to define at least one flow channel. A reaction gas flows through the flow channel and deposits on the plurality of substrates. At least one of the plurality of raised portions includes a heat insulation structure. The vapor phase film deposition apparatus further comprising a heating element disposed on one side of the susceptor, which is opposite to the opposing face member.

6 Claims, 10 Drawing Sheets

VAPOR PHASE FILM DEPOSITION APPARATUS

BACKGROUND OF THE INVENTION

1. Field of the Invention

The present invention relates to a vapor phase film deposition apparatus, particularly to a vapor phase film deposition apparatus with heat insulation structure.

2. Description of the Prior Art

In the current semiconductor industry, a thin film is usually grown with the vapor phase deposition method. US patent 2015096496 described a method to improve conventional planetary type MOCVD reactor, please refer to FIG. 1, which is the exploded perspective view shows a reactor structure in the said patent. The opposing face member 30 has recessed and raised profile (recessed portion 34 and raised portion 36), while in the conventional structure opposing face member is simply flat shape. The method disclosed in the said patent gives good growth rate distribution and less carrier gas consumption.

However, the configuration in the said patent has some disadvantages. FIG. 2 shows part of assemblage of the reactor structure in US patent 2015096496, where the parts are disposed in cold wall reactor chamber so that the opposing face can be kept relatively low temperature. The reason is because high opposing face temperature advances chemical reaction in flow channel too much, leading to bad thickness uniformity and bad material efficiency. An opposing member 39 having a plurality of raised portions 36 and recessed members 34. Chamber wall 40 is cooled by for cooling water 41, arranged on the other side of chamber wall inner surface. The heat generated at heater 43 goes through susceptor 20, substrate 21, opposing face member 30 and chamber wall 40 in turn, and finally transferred to the water 41. A substrate 21 is arranged on a base susceptor 20. The reaction gas may flow through the recessed members 34, and deposits on the substrate 21 after various chemical reaction process.

In the abovementioned structure, the distance H1 between the raised portions 34 and the substrate 21 is shorter, and the distance H2 between the recessed members 36 and the substrate 21 is longer. Therefore, the heat transfer efficiency between the raised portions 34 and the substrate 21 is better. Therefore, whole heat loss becomes larger than that in conventional type, because of the existence of raised portion with large heat transfer efficiency. Large heat loss may cause large temperature difference between upper-and-lower surfaces of substrate, leading to large wafer bowing. Besides, in such a case, much electric power is used to maintain the uniformity of temperature in the fabrication process, which would increase the cost.

Accordingly, how to improve the problem of heat energy loss through raised portion of the opposing face member in a vapor phase film deposition apparatus has become an important topic in the related fields.

SUMMARY OF THE INVENTION

The present invention provides a vapor phase film deposition apparatus, which comprises a susceptor where a plurality of substrates is placed thereon; and an opposing face member disposed opposite to the susceptor and having a plurality of recessed and raised profiles, wherein the raised portions protrude toward the susceptor to define at least one flow channel, and wherein at least one of the raised portions has a heat insulation structure, whereby the reaction gas is deposited on the plurality of substrates through the flow channel and recessed portion. The vapor phase film deposition apparatus also comprises a heating element disposed on one side of the susceptor, which is opposite to the opposing face member.

In one embodiment, a hollow portion is formed on one side of the raised portion, which is opposite to the susceptor, to function as the heat insulation structure.

In one embodiment, the vapor phase film deposition apparatus of the present invention further comprises a heat insulation material disposed inside the hollow portion of the raised portion.

In one embodiment, the heat insulation material disposed inside the hollow portion may include silicon oxide materials such as quartz, oxide ceramic materials such as alumina or nitride material such as silicon nitride.

In one embodiment, a top region of the raised portion is separated from the opposing face member as a top region member.

In one embodiment, the material of the top region member has a low thermal conductivity or a high reflectivity or both of low thermal conductivity and high reflectivity.

In one embodiment, the material comprises metallic materials such as molybdenum, silicon oxide materials such as quartz or opaque quartz, oxide ceramic materials such as alumina, carbon materials including those coated by other material such as SiC-coated graphite, carbide materials as silicon carbide (SiC) or nitride materials such as silicon nitride. In one embodiment, the vapor phase film deposition apparatus of the present invention further comprises at least one baffle member disposed inside the hollow portion, the baffle member is a reflector to reflect radiation.

In one embodiment, the material of the baffle member comprises metallic materials such as molybdenum, silicon oxide materials such as quartz or opaque quartz, oxide ceramic materials such as alumina, carbon materials including those coated by other material such as SiC-coated graphite, carbide materials as silicon carbide (SiC) or nitride materials such as silicon nitride.

In one embodiment, the material of the opposing face member is selected from a group including metallic materials, silicon oxide materials, oxide ceramic materials, carbon materials, carbide materials or nitride materials, and combinations thereof.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1:
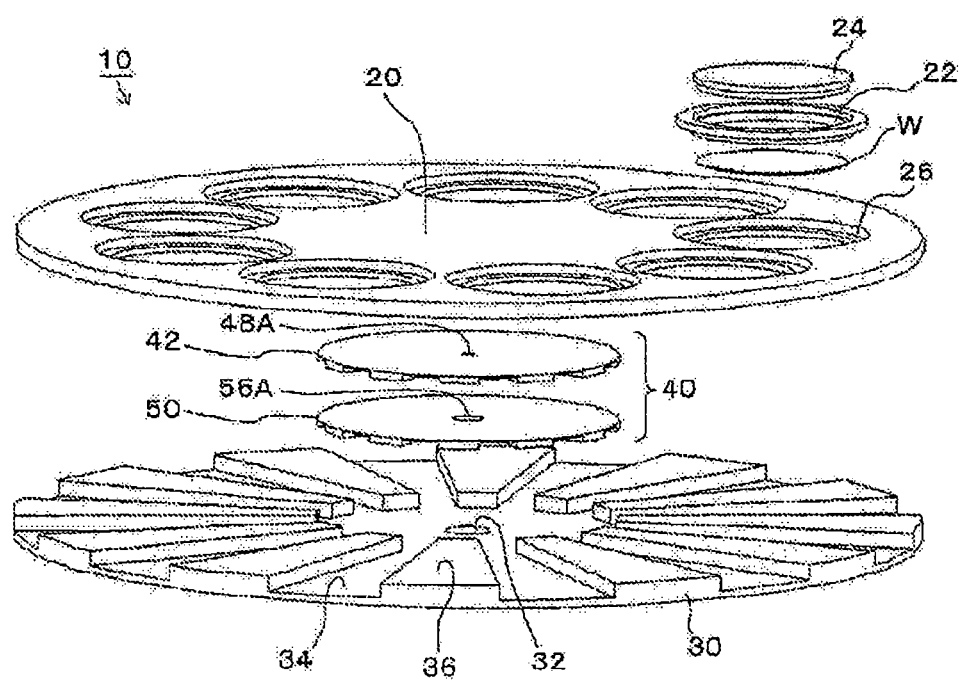
FIG. 1 is an exploded perspective view shows a reactor structure in prior art.
Figure 2:
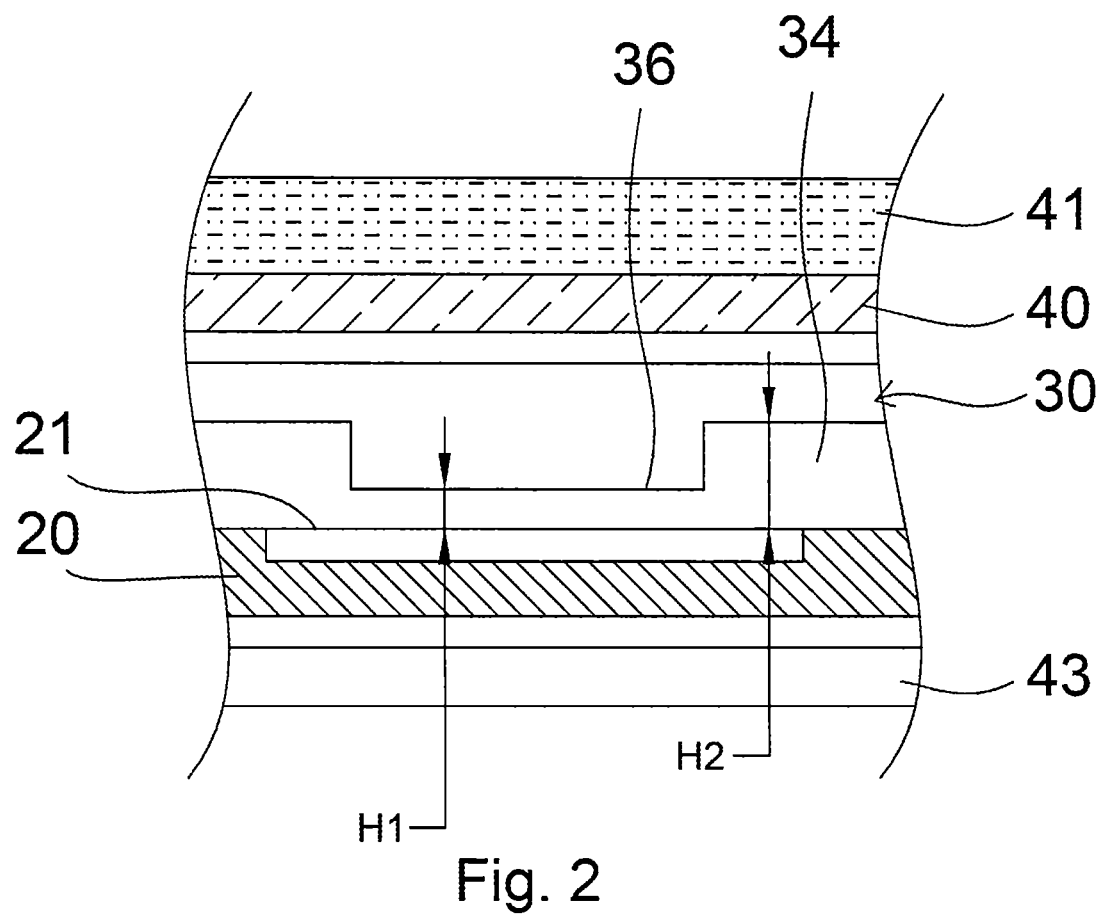
FIG. 2 is part of a cross-sectional view schematically showing the vapor phase film deposition apparatus in prior art.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below.

Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 3:
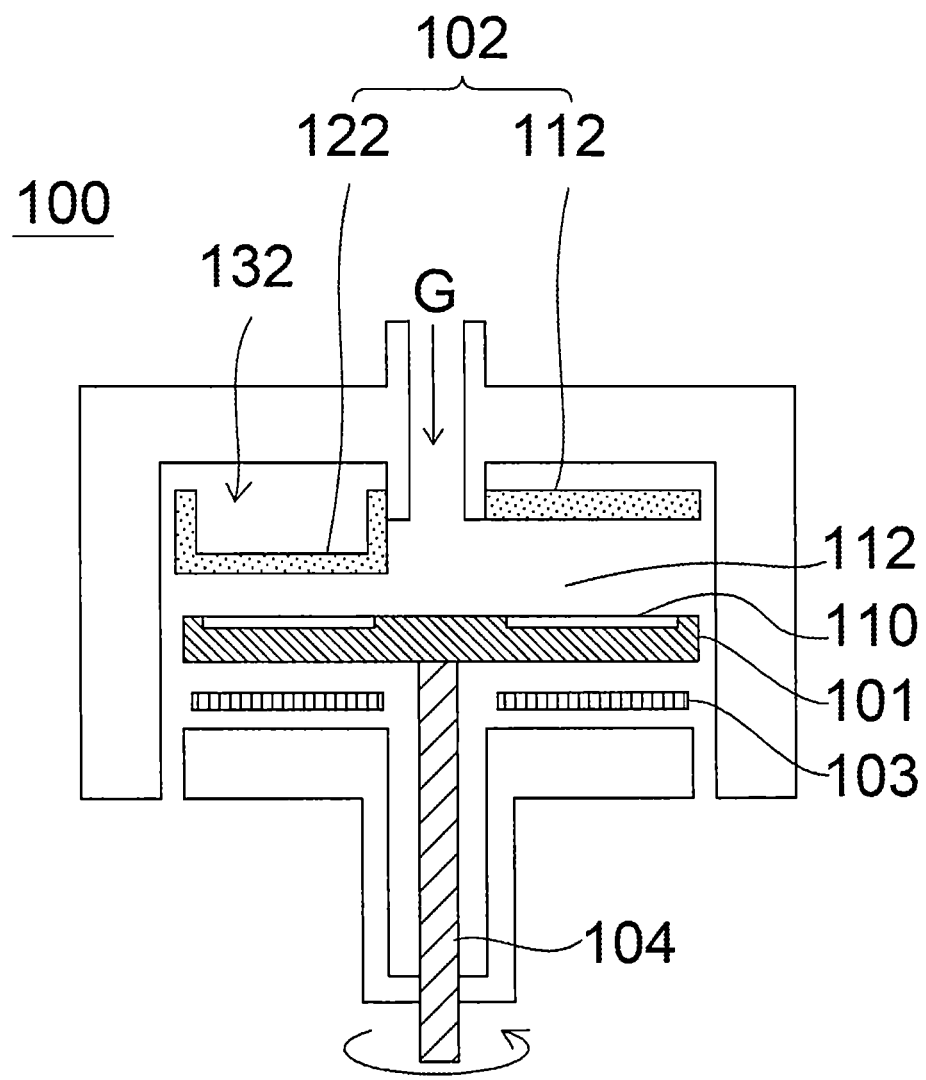
FIG. 3 is a side view of the vapor phase film deposition apparatus according to one embodiment of the present invention.
Figure 4:
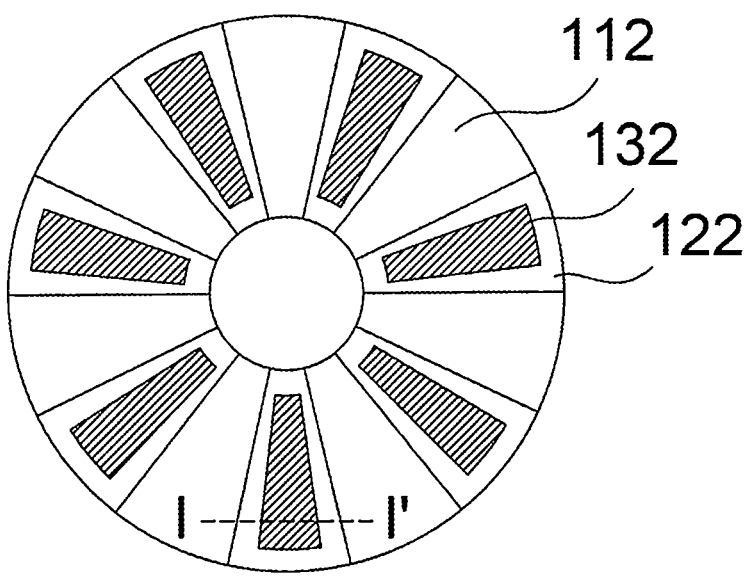
FIG. 4 is a top view of the opposing face member according to one embodiment of the present invention.

Refer to FIG. 3 and FIG. 4, the vapor phase film deposition apparatus 100 of the present invention comprises a susceptor 101, an opposing face member 102 and heat element 103. The susceptor 101 receives a plurality of substrates 110. The opposing face member 102 is disposed opposite to the susceptor 101 and has a plurality of raised portions 122. The raised portions 122 protrude toward the susceptor 10 to define at least one flow channel 112. A reaction gas G flows through the at least one flow channels 112 and deposits on the plurality of substrates 110.

The material of the opposing face member 102 is selected from a group including metallic materials such as molybdenum, silicon oxide materials such as quartz or opaque quartz, oxide ceramic materials such as alumina, carbon materials including those coated by other material such as SiC-coated graphite, carbide materials as silicon carbide (SiC) or nitride materials such as silicon nitride.

At least one of the plurality of the raised portions 122 may include a heat insulation structure. In one embodiment, each raised portion 112 may have the heat insulation structure. The heat insulation structure will be described in detail below.

The vapor phase film deposition apparatus of the present invention further comprises a heating element 103 and a driving component 104. The heating element 103 is disposed on one side of the susceptor 101, which is opposite to the opposing face member 102, used to provide heat energy for the vapor phase deposition process to enable the chemical reaction of the reaction gases. The driving component 104 is coupled to the susceptor 101, driving the susceptor 101 to undertake orbital revolution or the substrate 110 to undertake axial spin.

Figure 5:
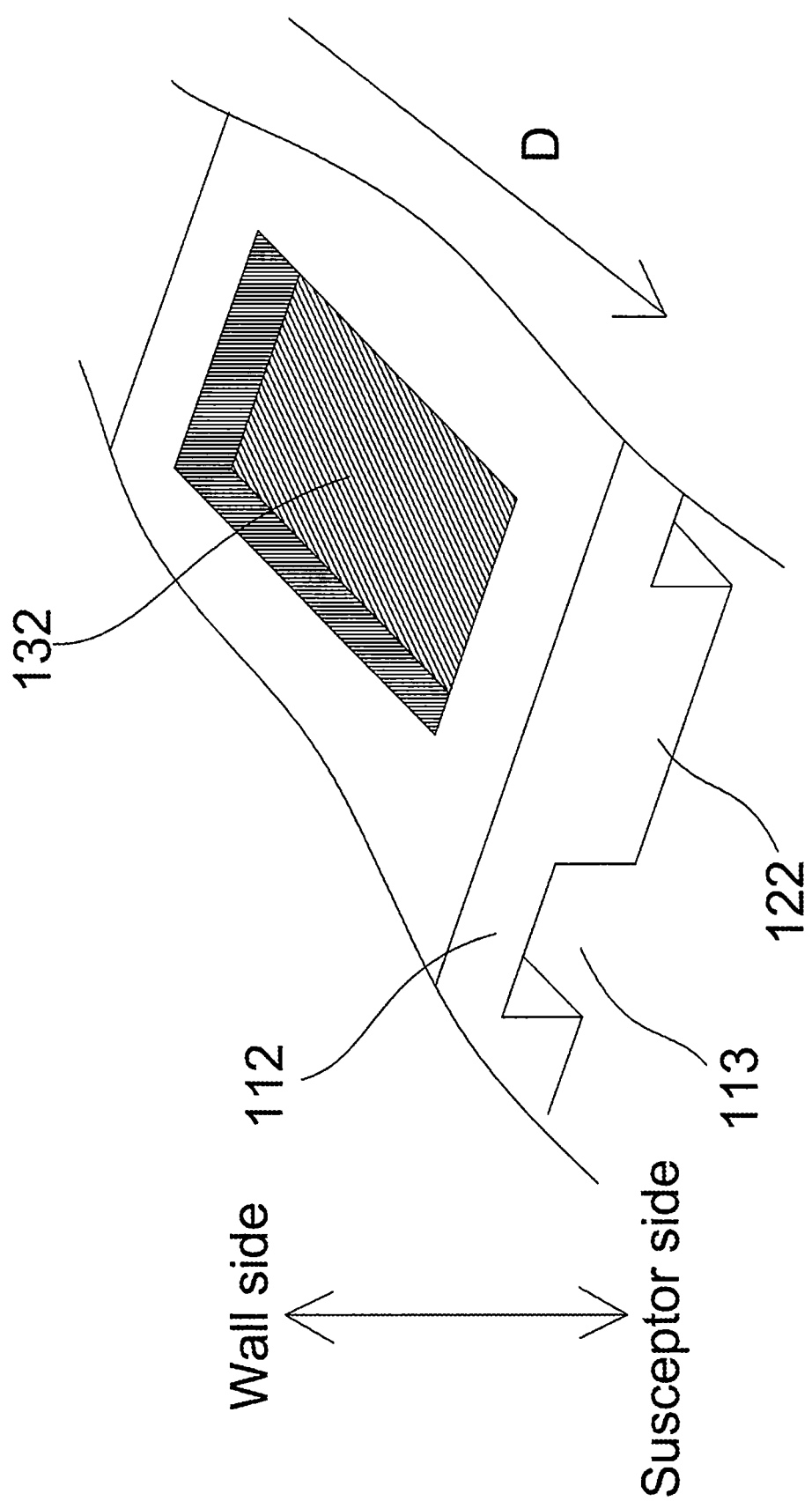
FIG. 5 is a perspective view of one embodiment of present invention.

In detail, please refer FIGS. 3 and 4 both, the opposing face member 102 may comprise a plurality of recessed and raised profiles, which is, raised portion 122 and recessed portion 112. The raised portion 122 includes a hollow portion 132 formed on one side of the raised portion 122, which is opposite to the susceptor 101, to function as the heat insulation structure. Refer to FIG. 5, the hollow portion 132 is formed toward the camber wall side, which is opposite to the suscepror side. The raised portion 122 and recessed portion 112 are elongated along the gas flow direction (radial direction) D. By such the configuration of the hollow portion 132, the heat conduction efficiency of the raised member 210 can be effectively decreased, and the heat loss in the related region can be also reduced. Furthermore, the deposition of the reaction gases only takes place in the flow channels 113, where temperature is kept low since the gap as opposing face member and chamber wall at the recessed portion is narrow. Therefore, the hollow portions 132 would not interfere with the deposition reaction.

Figure 6:
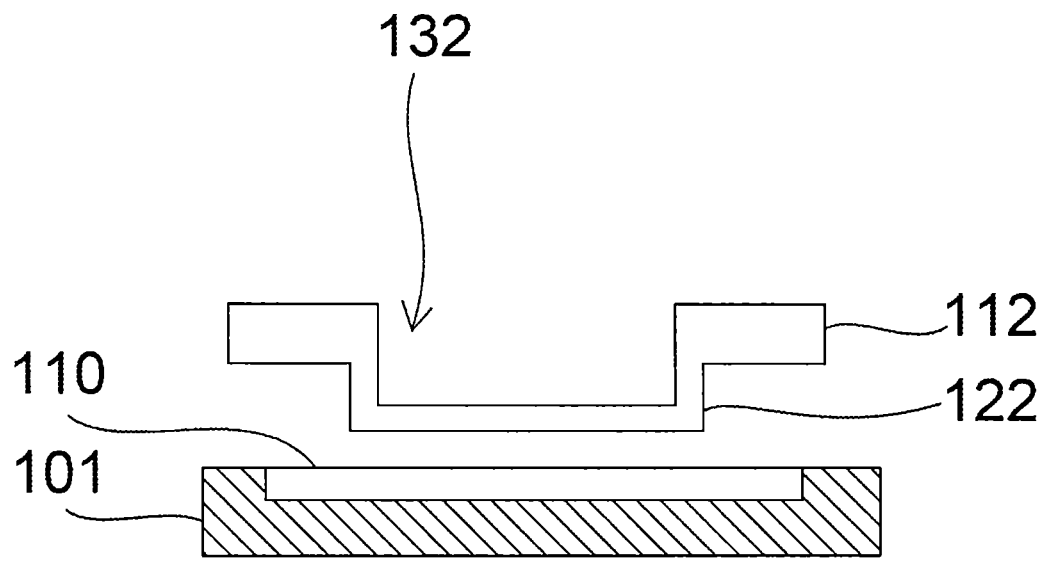
FIG. 6 is a cross-sectional view of one embodiment of present invention along line I-I' in FIG. 4.
Figure 7:
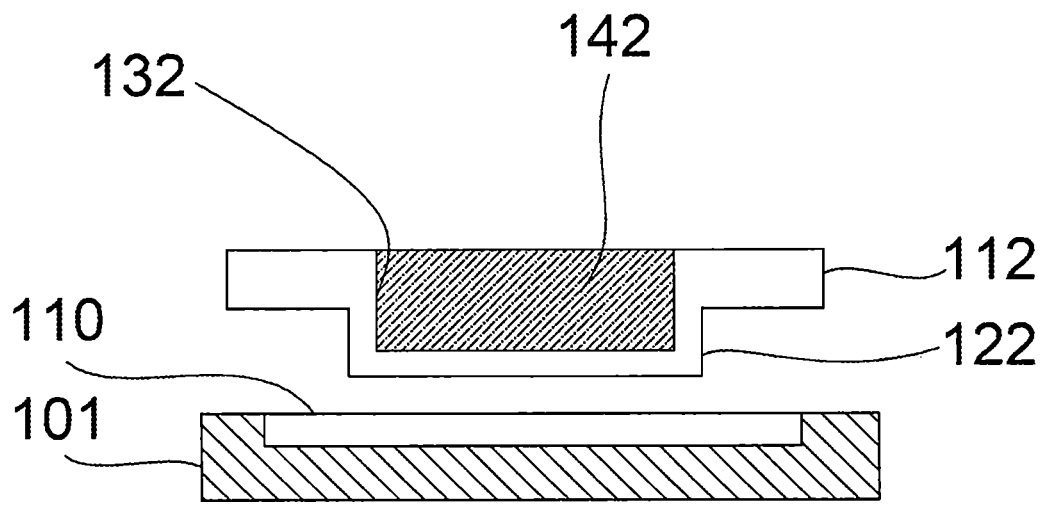
FIG. 7 is a side view schematically showing a vapor phase film deposition apparatus with heat insulation structures according to another embodiment of the present invention.

Refer to FIG. 6, which is a cross-sectional view of one embodiment of present invention along line I-I' in FIG. 4. The raised portion 122 includes a hollow portion 132 formed on one side of the raised portion 122, which is opposite to the susceptor 101, to function as the heat insulation structure. However, heat insulation structure of the present invention is not limited. Please refer to FIG. 7, the vapor phase film deposition apparatus further comprises a heat insulation material 142 disposed inside the hollow portion 132. The heat insulation material 142 may include silicon oxide materials such as quartz, oxide ceramic materials such as alumina or nitride material such as nitride.

Figure 8A:
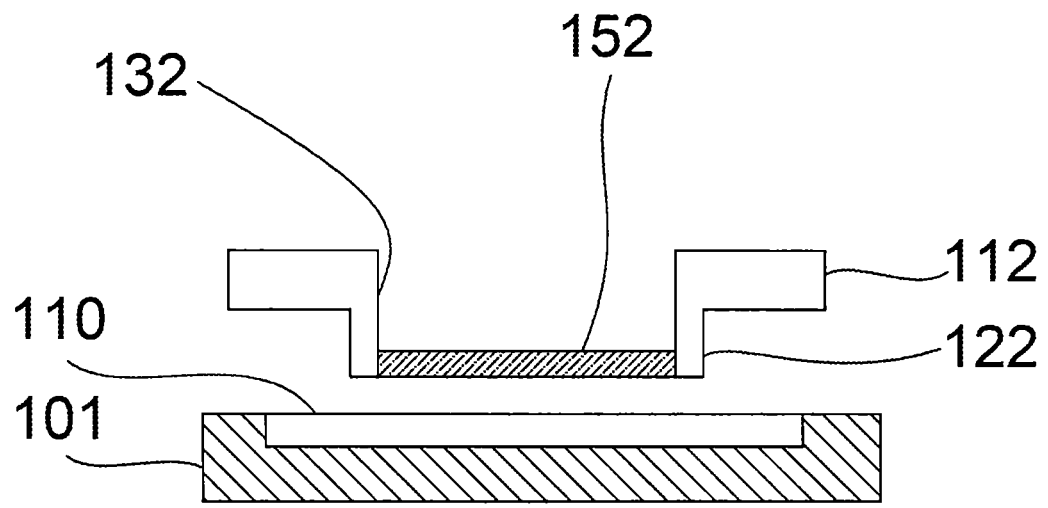
FIGS. 8A and 8B are side views schematically showing vapor phase film deposition apparatuses with heat insulation structures according to other embodiments of the present invention.
Figure 8B:
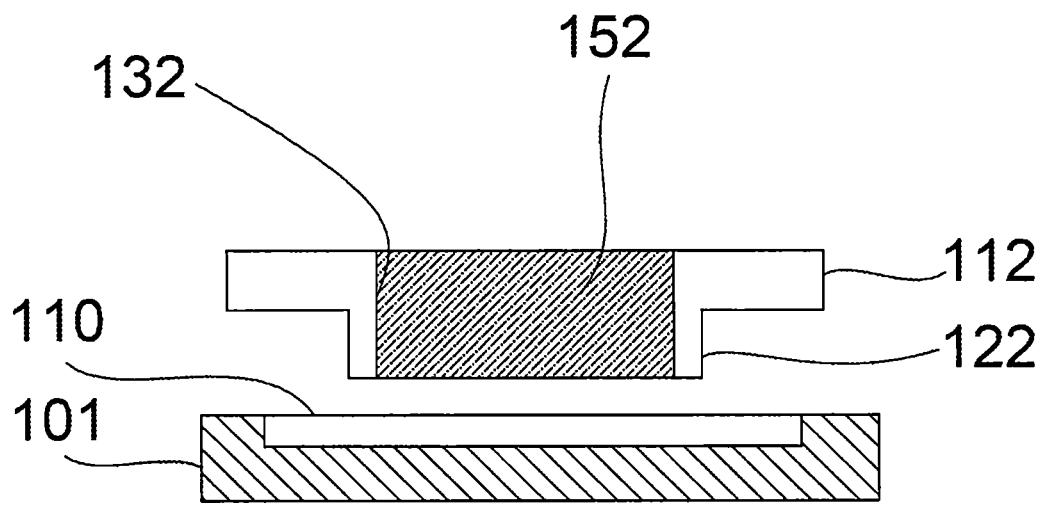

According to the other embodiment, the top region of the raised portion 122 is separated from the opposing face member 102 as a top region member 152. In one embodiment, the top region member 152 may occupy at least part of the hollow portion 132, as shown as FIG. 8A. In the other embodiment, the top region member 152 may occupy almost all of the hollow portion 132, as shown as FIG. 8B.

The material of the top region member 152 has a low thermal conductivity, a high reflectivity or both of low thermal conductivity and high reflectivity. For example, the material of the top region member 152 comprises metallic materials such as molybdenum, silicon oxide materials such as quartz or opaque quartz, oxide ceramic materials such as alumina, carbon materials including those coated by other material such as SiC-coated graphite, carbide materials as silicon carbide (SiC) or nitride materials such as silicon nitride.

Figure 9:
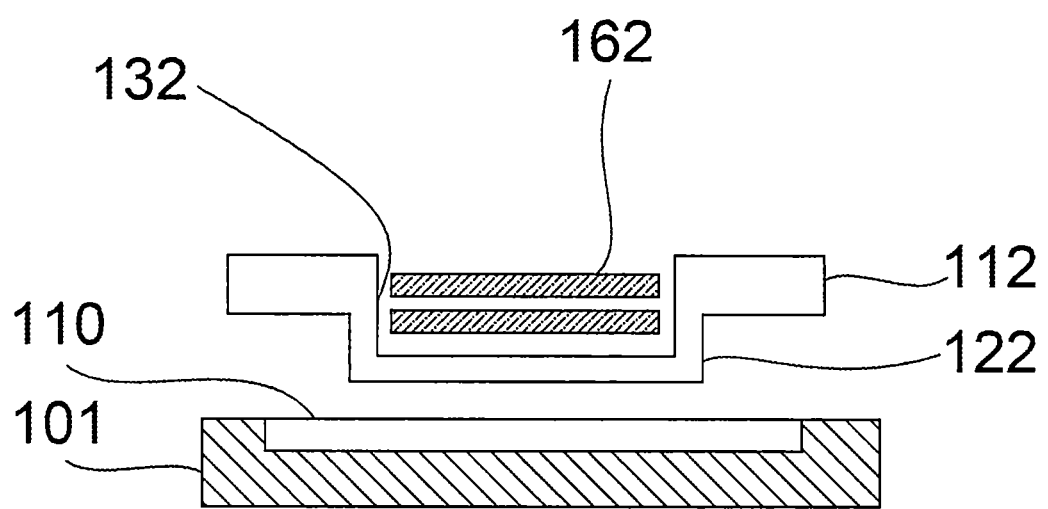
FIG. 9 is side views schematically showing vapor phase film deposition apparatuses with heat insulation structures according to still other embodiment of the present invention.

According to another embodiment, the vapor phase film deposition apparatus of the present invention further comprises at least one baffle member 162 disposed inside the hollow portion 132, as shown as FIG. 9. The baffle member 162 is a reflector to reflect radiation. The material of the baffle member 162 comprises metallic materials such as molybdenum, silicon oxide materials such as quartz or opaque quartz, oxide ceramic materials such as alumina, carbon materials including those coated by other material such as SiC-coated graphite, carbide materials as silicon carbide (SiC) or nitride materials such as silicon nitride.

Via the abovementioned structures is reduced the heat radiation efficiency or the heat conduction efficiency of the raised portions and thus decreased the loss of heat energy. Thereby, the heat conduction efficiency and the heat radiation efficiency can be reduced simultaneously.

In order to further demonstrate the advantage of the present invention, the simulations of the average heat consumptions of the vapor phase film deposition apparatuses of the conventional technology and the present invention are shown below.

Figure 10A:
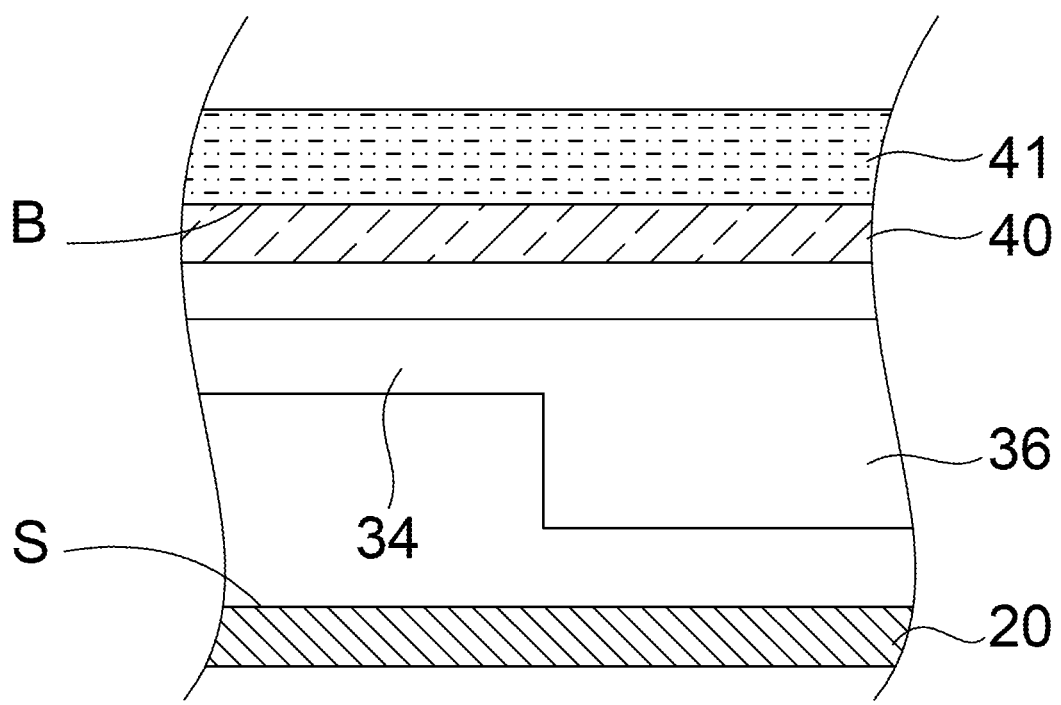
FIGS. 10A and 10B are diagrams showing the simulation models of prior art and one embodiment of present invention, respectively.
Figure 10B:
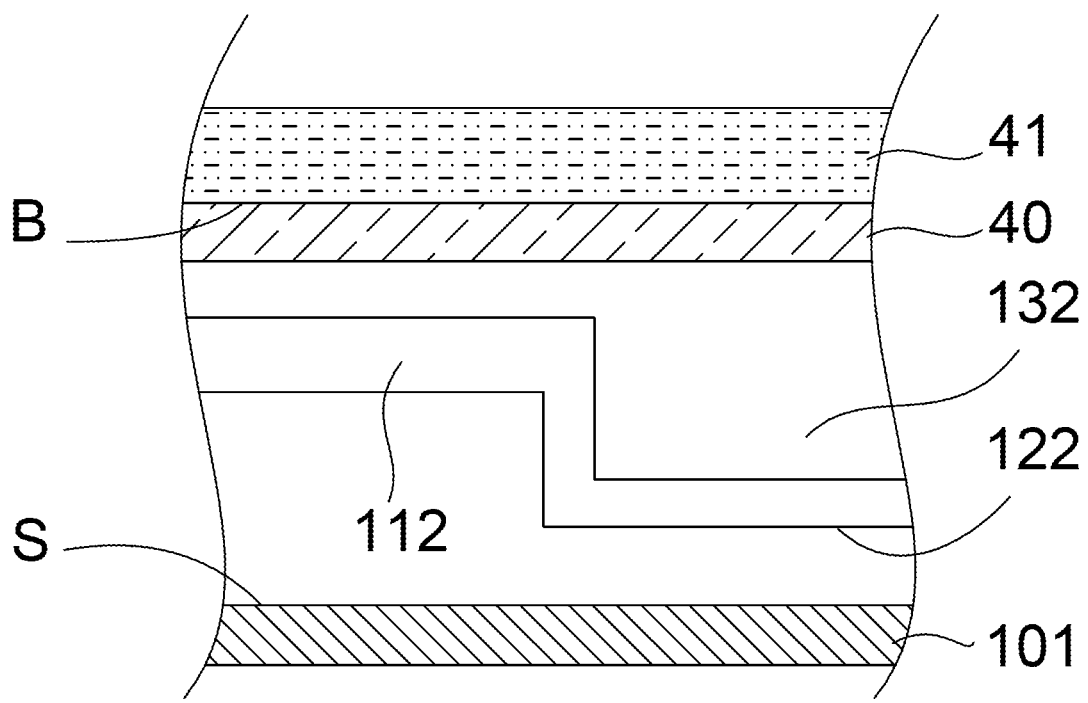

Herein, thermal simulation was performed for both the vapor phase film deposition apparatuses of US patent 2015096496 and the present invention. The simulation models of US patent 2015096496 and the present invention are shown in FIGS. 10A and 10B, respectively. Please noted that the configuration, dimension of the elements of the said simulation models are almost the same, beside the heat insulation structure. In detail, the simulation model of prior art has no any heat insulation structure on the raised portion, however, the simulation model of the present invention has a hollow portion on the raised portion as the heat insulation structure.

Heat transfer by conduction and radiation is taken into account in this simulation. The simulated area was from susceptor surface S to cooling water boundary B. The material of chamber wall is stainless, the opposing face member and susceptor are made of graphite, and general physical property of each material was used in this simulation. The low temperature boundary condition at the cooling water boundary is 60 degree C. and the high temperature boundary condition at the susceptor surface is 1000 degree C.

Figure 11:
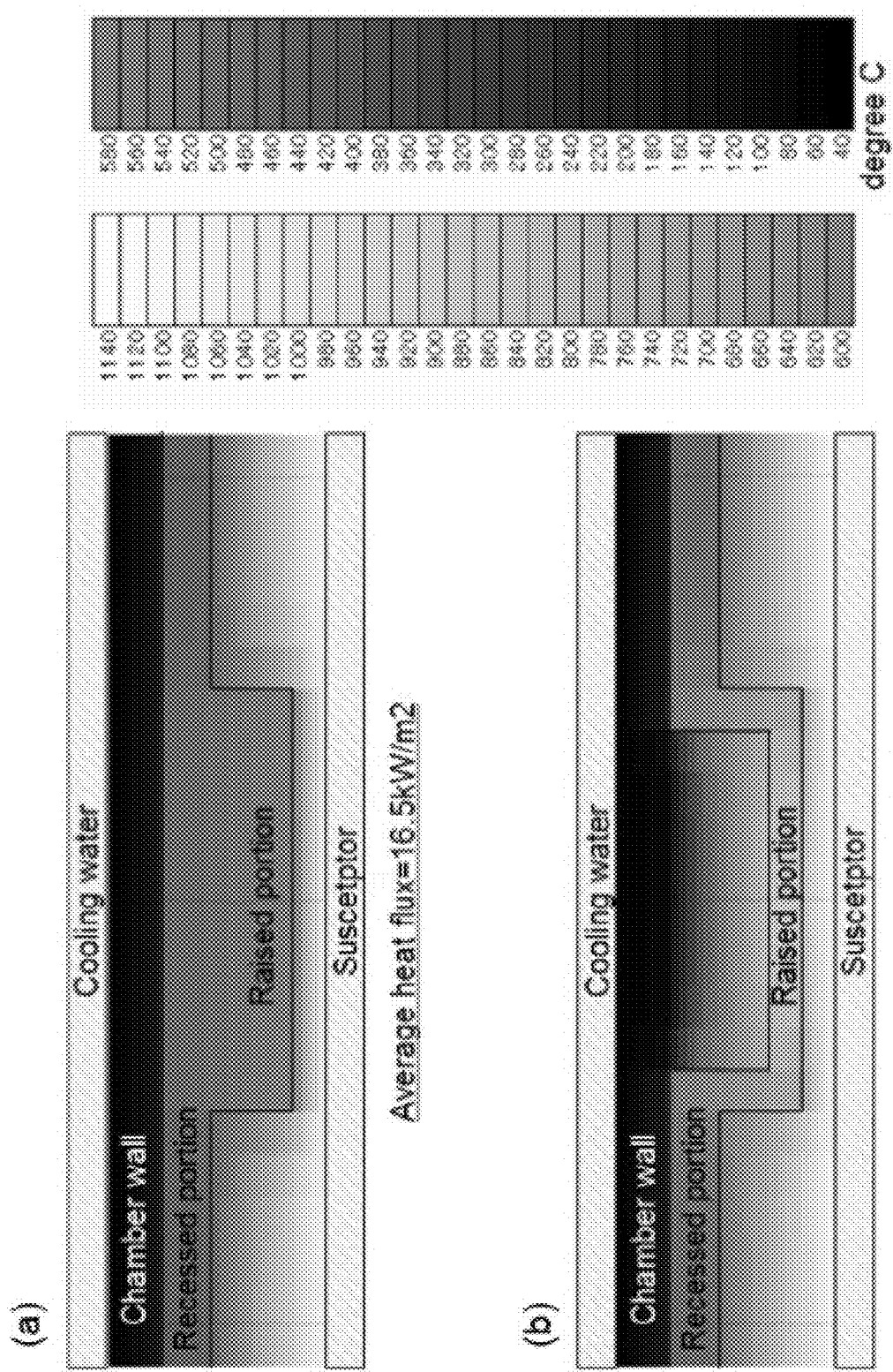
FIG. 11 is diagram showing the simulation result.

The 2D temperature distributions are shown in FIG. 11, wherein (a) part is the simulation result of prior art and (b) part is the simulation result of the present invention.

Refer to of FIG. 11, the average heat flux in the simulated area in prior art is 16.5 kW/m2 (as shown as part (a)), and the average heat flux in the simulated area in the present invention is 13.2 kW/m2 (as shown as part (b)). Although the raised portion is much closer to the substrate compare to the recessed portion in the present invention, the heat insulation structure may influence the heat transfer so as to suppress heat loss. The decreased heat loss in the present invention accompany with the reduced average heat flux, in detail, the vapor phase film deposition apparatus reduces the heat flux by 20% compared to the prior art, so as the electric charge may also be reduced and the problem of wafer bowing may be suppressed. Furthermore, according to FIG. 11, the temperature in the raised portion of the present invention is higher than prior art, which is benefit for the vapor phase film deposition process.

In conclusion, the present invention provides a vapor phase film deposition apparatus that comprises a opposing face member with heat insulation structures to solve the problem of heat loss in the conventional vapor phase film deposition apparatus. Via the abovementioned structures, the present invention can reduce the heat conduction efficiency or the heat radiation efficiency without interfering with the vapor phase reaction.

Therefore, the present invention can solve the problem of massive heat loss, improve the unbalanced temperature distribution caused by heat loss, prevent distortion of the substrates, reduce the power spent in maintaining the required temperature, and decrease the fabrication cost.

What is claimed is:

1. A vapor phase film deposition apparatus comprising:
   a susceptor receiving a plurality of substrates;
   an opposing face member disposed opposite to the susceptor and having a plurality of raised portions, wherein the plurality of raised portions protrudes toward the susceptor to define at least one flow channel, and wherein the at least one flow channel allows reaction gases to flow through and deposit on the plurality of substrates, wherein at least one of the plurality of raised portions includes a hollow portion formed on one side of the at least one raised portion, which is opposite to the susceptor, to function as a heat insulation structure;
   at least one baffle member disposed inside the hollow portion, the at least one baffle member is a reflector to reflect radiation; and
   a heating element disposed on one side of the susceptor, which is opposite to the opposing face member.

2. The vapor phase film deposition apparatus according to claim 1, wherein a top region of the at least one raised portion is separated from the opposing face member as a top region member.

3. The vapor phase film deposition apparatus according to claim 2, wherein a material of the top region member has a low thermal conductivity or a high reflectivity or both of low thermal conductivity and high reflectivity.

4. The vapor phase film deposition apparatus according to claim 3, wherein the material comprises metallic materials, silicon oxide materials, oxide ceramic materials, carbon materials, carbide materials or nitride materials.

5. The vapor phase film deposition apparatus according to claim 1, wherein a material of the at least one baffle member comprises metallic materials, silicon oxide materials, oxide ceramic materials, carbon materials, carbide materials or nitride materials.

6. The vapor phase film deposition apparatus according to claim 1, wherein a material of the opposing face member is selected from a group including metallic materials, silicon oxide materials, oxide ceramic materials, carbon materials, carbide materials or nitride materials, and combinations thereof.

* * * * *